United States Patent
Huang-Lu et al.

(10) Patent No.: US 6,191,602 B1
(45) Date of Patent: Feb. 20, 2001

(54) WAFER ACCEPTANCE TESTING METHOD AND STRUCTURE OF A TEST KEY USED IN THE METHOD

(75) Inventors: Shiang Huang-Lu, Hsinchu; Mu-Chun Wang, Hsinchu Hsien; Kun-Cho Chen, Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/220,097

(22) Filed: Dec. 23, 1998

(51) Int. Cl.$^7$ .................................................. G01R 31/26
(52) U.S. Cl. .................................................. 324/765
(58) Field of Search ........................ 324/765, 763, 324/754

(56) References Cited

U.S. PATENT DOCUMENTS 5,966,022 * 10/1999 Budnaitis et al. ................ 324/765

* cited by examiner

*Primary Examiner*—Safet Metjahic
*Assistant Examiner*—James C Kerveros
(74) *Attorney, Agent, or Firm*—Thomas, Kayden, Horstemeyer & Risley

(57) ABSTRACT

A wafer acceptance testing (WAT) method with a test key is provided. The test key structure includes a testing structure on a substrate. An inter-layer-dielectric layer covers over the substrate to isolate the testing structure. A grounded metal layer is located on the inter-layer dielectric layer. An interconnecting structure is located on the grounded metal layer. A conductive pad layer and a passivation layer are sequentially located on the interconnecting structure. The testing structure is electrically coupled to the interconnecting structure. The interconnecting structure is also electrically coupled to the conductive pad layer. The grounded metal layer is grounded without any further coupling such that the grounded metal layer is not coupled to the testing structure and the interconnecting structure.

20 Claims, 3 Drawing Sheets

WAFER ACCEPTANCE TESTING METHOD AND STRUCTURE OF A TEST KEY USED IN THE METHOD

BACKGROUND OF THE INVENTION

1. Field of the Invention

This invention relates to semiconductor fabrication, and more particularly to a wafer acceptance testing (WAT) method, including a use of a test key.

2. Description of Related Art

In semiconductor fabrication, a semiconductor device or an integrated circuit (IC) should be continuously tested in every step so as to maintain device quality. Usually, a testing circuit is simultaneously fabricated with a actual device so that quality of the actual device can be judged by a performance of the testing circuit. The quality of the actual device therefore can be well controlled.

A typical method to test a wafer is called a wafer acceptance testing (WAT) method, which can measure defects of the wafer. The WAT method includes providing several test keys distributed in a periphery region of a die, which is desired to be tested. The test keys typically are formed on a scribe line between dies, and are electrically coupled to an external terminal through a metal pad. A module of the test keys is selected and each test key off the selected module is respectively used for a test of different property of the wafer, such as threshold voltage ($V_{TH}$) or saturate current $I_{DSAT}$. A controlled bias is applied to the test keys, and the induced current is read out to detect defects on the wafer.

FIG. 1 is a top view of a wafer, schematically illustrating a typical structure of a wafer. In FIG. 1, several dies 102 are formed on a wafer 101 with a matrix distribution. A scribe line 104 is naturally formed between dies 102. In each of dies 102, an actual device, including, for example metal-oxide semiconductor (MOS) transistors, capacitors, and interconnects, is formed. In semiconductor fabrication, every process is performed on the whole wafer 101 so that several testing circuits, each of which is similar to the actual device in each of the dies 102, are also simultaneously formed in the scribe line 104. The testing circuits are electrically coupled to an external read out circuit through several metal pads 106. Each pad serves as a testing key 106 for a test of a property desired to be tested. Thus, the test keys 106 are distributed on the wafer 101 and are user to test the wafer. The is a typical WAT method.

Most of device damages or wafer defects in fabrication usually result from plasma processes. Unfortunately, plasma processes are very essential in semiconductor fabrication, such dry etching or doping processes. During the plasma processes, the wafer is bombard by energetic ions and results in a damage. In addition, since the plasma ions carry a lot of charges, it may also cause a damage to the wafer due to statistic charge accumulation. For example, energetic plasma ions can penetrate through a gate to cause a damage to the gate, and further leave their charges inside the gate. Those charges from ions are accumulated by a gate oxide layer, resulting in a degradation of its isolation performance. A device current leakage is therefore induced. All these kinds of damage resulting from plasma processes are called a plasma process induced damage (P2ID).

FIG. 2 is a cross-sectional view of a portion of a substrate, schematically illustrating a structure of a conventional test key. In FIG. 2, there is a substrate 200. A testing structure 202, such as a transistor or a capacitor, is formed on the substrate 200. An inter-layer dielectric layer 204 is formed over the substrate 200 is isolate the testing structure 202. An interconnecting structure 206 is formed on the inter-layer dielectric layer 204. The interconnecting structure 206, as usual, includes interconnecting metal layer 208 and inter-metal dielectric layer 210. A metal pad layer 212 is formed on the interconnecting structure 206. A passivation layer 214 is on the top. The testing structure 202 is coupled to the interconnecting metal layer 208 through, usually, a contact. Again through a via, the interconnecting metal layer 208 is coupled to the metal pad layer 212. Desired testing signals can be obtained by reading signals at the metal pad layer 212.

The structure of the test key shown in FIG. 2 is simultaneously formed while the actual devices in each die are formed on the substrate 200 at other portion, such as the structure shown in FIG. 1. The formation of the test key includes several plasma processes. If there is any damage occurring, it can only tell that the actual device may also damage. It is difficult to clearly pin down where the damage is. Device performance defect may result from the damage of the testing structure 202, the interconnecting structure 206, or others. Engineers need to spend a lot of time to check every steps to find out which steps may cause damage. This is time consuming and causes a degradation of throughput.

SUMMARY OF THE INVENTION

It is therefore an objective of the present invention to provide a wafer acceptance testing (WAT) method with an improved test key so as to efficiently find out whether the damage is from a device structure or from an interconnecting structure. Because the damage can be easily find out, the production rate is not degraded. Fabrication cost do not increase.

In accordance with the foregoing and other objectives of the present invention, a wafer acceptance testing (WAT) method with an improved test key is provided. The improved test key structure includes a testing structure on a substrate. An inter-layer dielectric layer covers over the substrate to isolate the testing structure. A grounded metal layer is located on the inter-layer dielectric layer. An interconnecting structure is located on the grounded metal layer. A conductive pad layer and a passivation layer are sequentially located on the interconnecting structure. The testing structure is electrically coupled to the interconnecting structure through, for example, a contact. The interconnecting structure is also electrically coupled to the conductive pad layer. The grounded metal layer is grounded through, for example, a grounded transistor or direct coupling to the substrate. The grounded metal layer is not coupled to the testing structure, the interconnecting structure, or any other structure. In this improved test key structure, the grounded metal layer can protect the testing structure from plasma processes for a formation of the interconnecting structure so that damage from either the testing structure or the interconnecting structure can be easily distinguished.

The WAT method of the invention includes measuring the improved test key to obtain a first testing result, and measuring conventional test key to obtain a second testing result, and analyzing the first testing result and the second testing result. If both the first and the second testing results are abnormal, the test device structure is damaged by plasma process during forming itself. If the first testing result is normal but the second result is abnormal, then the test device structure is damaged by plasma process during forming the interconnecting structure. If both the first and the second testing results are normal, it means that there is not plasma damage.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 3:
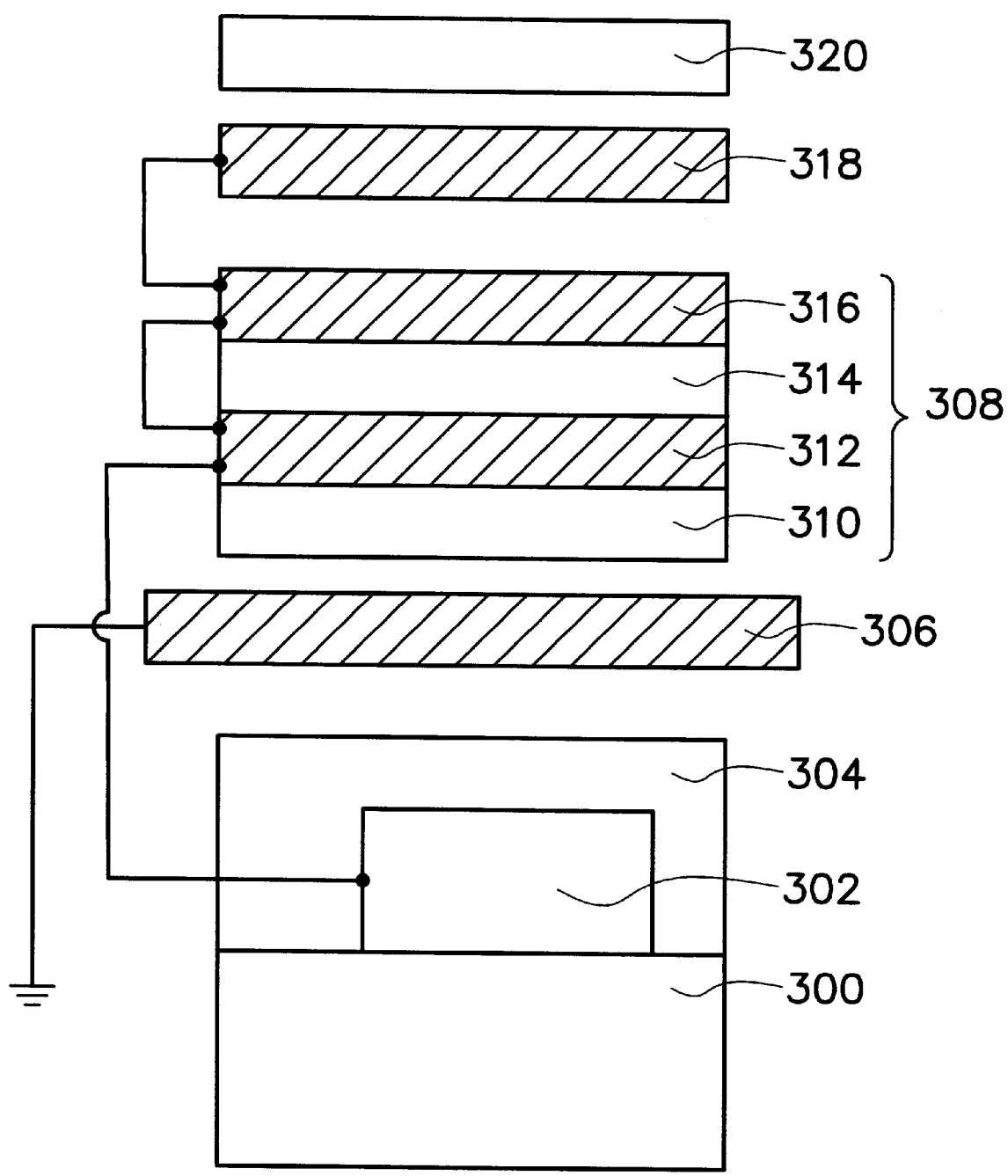
FIG. 3 is a cross-sectional view of a portion of a substrate, schematically illustrating a test key structure, according to a preferred embodiment of the invention.

FIG. 3 is a cross-section view of a portion of a substrate, schematically illustrating a test key structure, according to a preferred embodiment of the invention. In FIG. 3, three is a substrate 300. A semiconductor testing structure 302, such as a transistor or a capacitor, is formed on the substrate 300. The transistor usually includes a metal-oxide semiconductor (MOS) transistor. An inter-layer dielectric layer 304 is formed over the substrate 300 so as to isolate the testing structure 302. A grounded metal layer 306 is located on the inter-layer dielectric layer 304. An interconnecting structure 308 is located on the grounded metal layer 306. A conductive pad layer 318, such as a metal pad layer, and a passivation layer 320 are sequentially located on the interconnecting structure 308.

The interconnecting structure 308 includes at least one level of interconnecting layer. A multilevel interconnecting structure is more often in the current semiconductor fabrication. In FIG. 3, two interconnecting metal layers 312, 316 are, for example, shown. The interconnecting metal layers 312, 316 are separated by inter-metal dielectric layers 310, 314 as an usual structure. The interconnecting metal layers 312, 316 are properly coupled through a via. In this manner, the interconnecting structure 308 includes the interconnecting metal layers 312, 316, and the inter-metal dielectric layers 310, 314. The testing structure 302 is electrically coupled to the interconnecting structure 308 through, for example, a contact. The interconnecting structure 308 is also electrically coupled to the conductive pad layer 318. The grounded metal layer 306 is grounded through, for example, a grounded transistor or direct coupling to the substrate 300. The grounded metal layer 306 is not coupled to the testing structure 302, the interconnecting structure 308, or any other structure.

In this test key structure shown in FIG. 3, the grounded metal layer 306, which is the main characteristic of the invention, is used to protect the testing structure 302 from plasma processes for a formation of the interconnecting structure 308 and the other rest structure. A device performance defect due to either a damage to the testing structure or a damage to the interconnecting structure can be easily distinguished. This reason is following.

The grounded metal layer 306 is grounded without any further coupling, when a plasma process is performed for the formation of, for example, the interconnecting structure 308, penetrating ions can be stop by the grounded metal layer 306, and extra charges carried by the ions are led to a charge sink. There is no charge accumulated by the test device structure at, for example, its gate oxide layer. The charge damage from plasma process, used to form the interconnect structure 308, is completely excluded. That is why two different types of damages on the test device structure can be easily distinguished. In order to obtain a better protection, the grounded metal layer 306 can be formed by a multi-layer structure. It also can include any kind of conductive material, in which metallic material is preferred.

Figure 1:
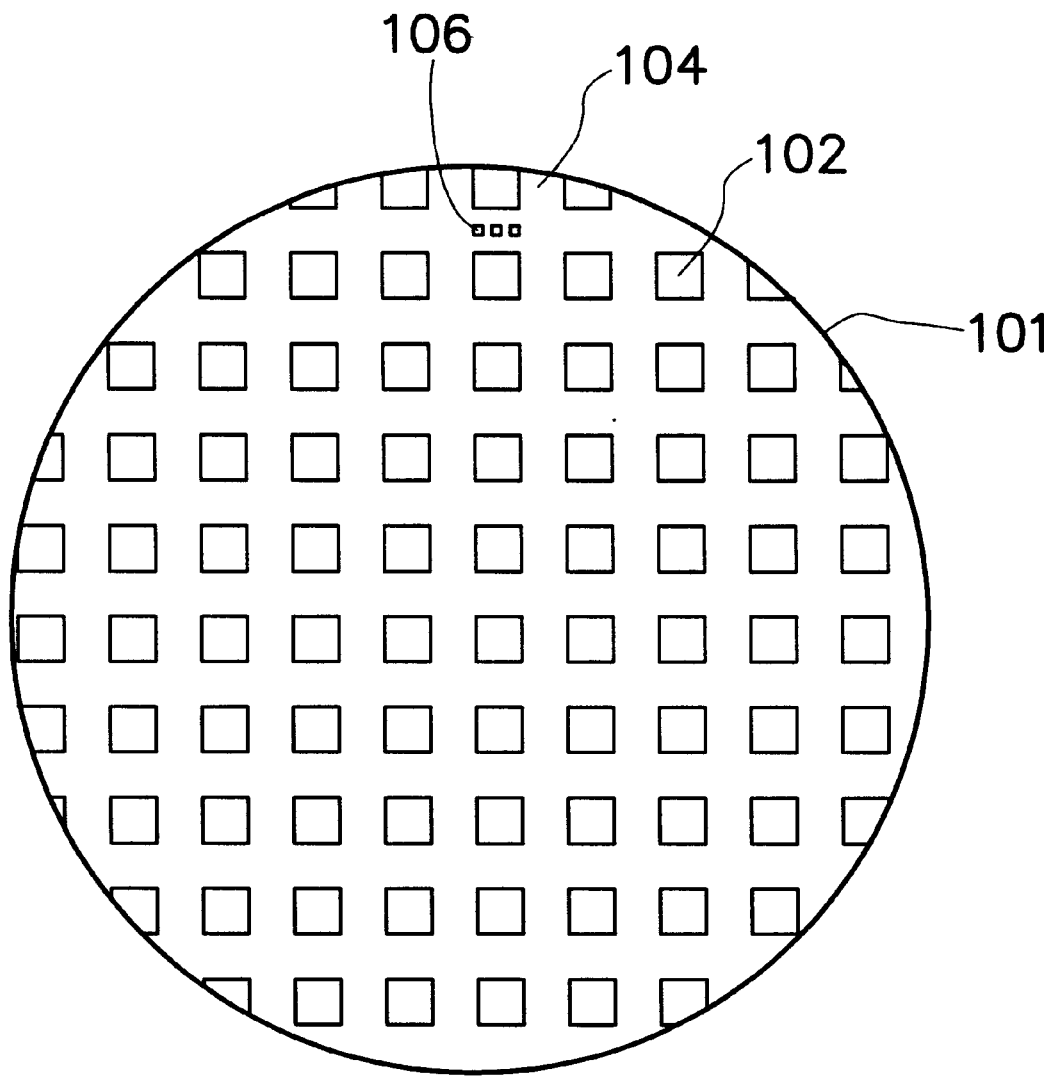
FIG. 1 is a top view of a wafer, schematically illustrating a typical structure of a wafer.
Figure 2:
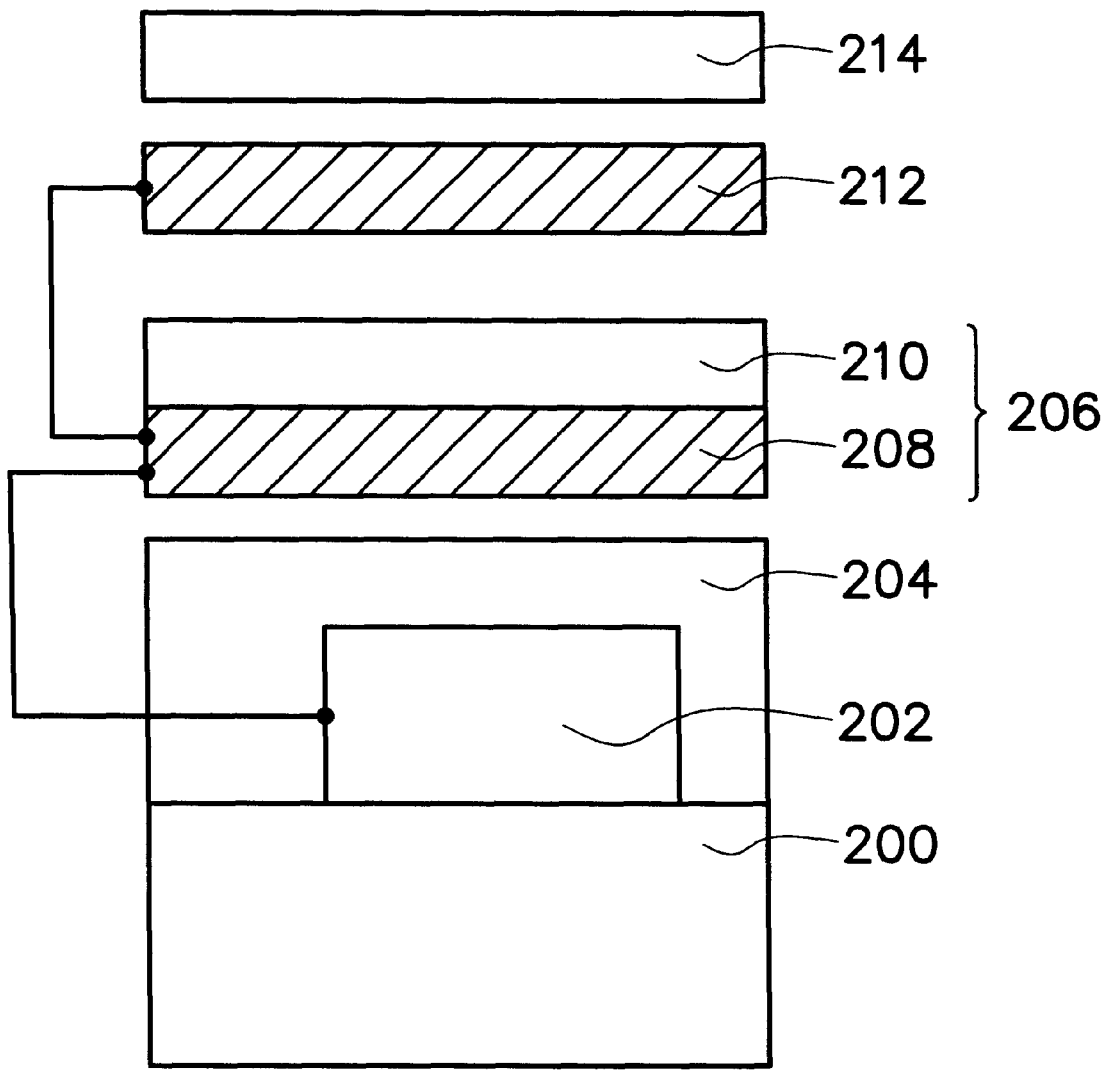
FIG. 2 is a cross-sectional view of a portion of a substrate, schematically illustrating a conventional test key structure.

The test key structure of the invention shown in FIG. 3 can be used together with the conventional test key shown in FIG. 2. A WAT method is proposed to analyze a first testing result measured from the test key structure of the invention and a second testing result from the conventional test key structure. For the conventional test key structure, if its test device structure 202 is damaged, the second test result is always abnormal. But an abnormal status of the second test result may also from a charge damage during forming the interconnecting structure 206. This is the blind point for the conventional test key structure. The blind point can opened by the test key structure of the invention. For the test key structure of the invention, there is no charge damage occurring on the test device structure 302 from the plasma process that is used to form the interconnecting structure 308. If the test device structure 302 is damaged, it must be from the plasma process used to form itself. Therefore, analyzing both the first result and the second result, a conclusion can be obtained at the third column.

Table 1 shows both the first and the second testing results and the analyzed results, according to the WAT method of the invention.

TABLE 1

| Results | | |
|---|---|---|
| First result | Second result | Locations where damage may occur |
| Abnormal | Abnormal | Test device structure |
| Normal | Abnormal | Interconnecting structure |
| Normal | Normal | No plasma damage |

In Table 1, if both the first test results is abnormal, it means that the test device structure 302 is damaged by the plasma process during forming itself. At this situation, the second test result naturally is also abnormal, since the damage globally occurs. If the first testing result is normal but the second result is abnormal, then the test device structure is damaged by plasma process during forming the interconnecting structures 206, 308. If both the first and the second testing results are normal, it means that there is no plasma damage.

The origin of plasma damage of the test device structures, 202, 302 is easily distinguished out by the WAT method of the invention. A damage of the test device structures, 202, 302 also implies that the actual device are damaged also. Once the damage reason is clearly analyzed out, engineers can efficiently modify the plasma fabrication process. The fabrication time and the fabrication cost can be effectively reduced.

In conclusion the invention has several characteristics as follows:

1. In the test key structure of the invention, a grounded layer 306 is introduced to be located at the location between the interconnecting structure 308 and the testing structure 302 so as to prevent a charge damage on the test device structure 302, in which the charge damage is induced by those plasma process used in the formation for the interconnecting structures, 206, 308.

2. Due to a combining use of the test key structure of the invention and the conventional test key structure, the reason to cause the plasma damage occurring on the test device structure and actual devices can be easily distinguished.

The invention has been described using an exemplary preferred embodiment. However, it is to be understood that the scope of the invention is not limited to the disclosed embodiment. On the contrary, it is intended to cover various modifications and similar arrangements. The scope of claims, therefore, should be accorded the broadest interpretation so as to encompass all such modifications and similar arrangements.

What is claimed is:

1. A test key structure, used in a wafer acceptance testing (WAT) method, the test key structure comprising:

a test device structure located on a wafer substrate;

an inter-layer dielectric layer covering over the substrate;

a conductive structure layer located on the inter-layer dielectric layer;

an interconnecting structure located on the conductive structure layer;

a conductive pad layer located on the interconnecting structure; and a passivation layer located on the conductive pad layer, wherein the test device structure is electrically coupled to the interconnect structure, which is further electrically coupled to the conductive pad layer, and the conductive structure layer is grounded without other electrical coupling.

2. The test key structure of claim 1, wherein the conductive structure layer is grounded through a grounded transistor.

3. The test key structure of claim 1, wherein the conductive structure layer is grounded through a direct coupling to the substrate.

4. The test key structure of claim 1, wherein the conductive structure layer comprises at least one conductive layer.

5. The test key structure of claim 1, wherein the conductive structure layer comprises metallic material.

6. The test key structure of claim 1, wherein the interconnecting structure comprises at least one inter-metal dielectric layer and at least on interconnecting metal layer, all of which are stacked on the conductive structure layer in an alternating sequence by starting from the inter-metal dielectric layer first.

7. The test key structure of claim 1, wherein the test device structure comprises a metal-oxide semiconductor (MOS) transistor.

8. The test key structure of claim 1, wherein the test device structure comprises a capacitor.

9. A method to distinguish a plasma damage origin, the method comprising:

providing a first test key, which comprises a first test device structure, a grounded conductive structure, and a first interconnecting structure sequentially located on substrate, wherein the grounded conductive structure is grounded and has no electrical coupling with the first test device structure and the first interconnecting structure;

providing a second test key, which comprises a second test device structure and a second interconnecting structure, with an electrical coupling, sequentially located on the substrate at a location other than the first test key, in which the first test device structure and the second device structure are simultaneously formed by a same first fabrication process, and the first interconnecting structure and the second interconnecting structure are simultaneously formed by a same second fabrication process;

testing the first test key to obtain a first testing result;

testing the second test key to obtain a second result; and analyzing the first testing result and the second testing result to distinguish a damage origin.

10. The method of claim 9, wherein the step of analyzing the first testing result and the second testing result comprises an algorithm that if both the first testing result and the second testing result are abnormal, then the first and the second test device structures are damaged by plasma during forming themselves.

11. The method of claim 9, wherein the step of analyzing the first testing result and the second testing result comprises an algorithm that if the first testing result is normal and the second testing result is abnormal, then the first and the second test device structures are damaged by plasma during forming the first and the second interconnecting structures.

12. The method of claim 9, wherein the step of analyzing the first testing result and the second testing result comprises an algorithm that if both the first testing result and the second testing result are normal, then there is no plasma damage occurring.

13. The method of claim 9, wherein the step of testing the first test key comprises a wafer acceptance testing (WAT) method.

14. The method of claim 9, wherein the first test key further comprises a first pad layer electrically coupled to the first interconnecting structure to serve as an output end for testing.

15. The method of claim 9, wherein the step of testing the second test key comprises a wafer acceptance testing (WAT) method.

16. The method of claim 9, wherein the second test key further comprises a second pad layer electrically coupled to the second interconnecting structure to serve as an output end for testing.

17. The method of claim 9, wherein the grounded conductive structure of the first test key is grounded through a grounded transistor.

18. The method of claim 9, wherein the grounded conductive structure of the first test key is grounded through a direct coupling to the substrate.

19. The method of claim 9, wherein the first test device structure comprises a metal-oxide semiconductor (MOS) transistor.

20. The method of claim 9, wherein the first test device structure comprises a capacitor.

* * * * *